United States Patent [19]

Taniguchi et al.

[11] Patent Number: 5,023,442
[45] Date of Patent: Jun. 11, 1991

[54] APPARATUS FOR OPTICALLY WRITING INFORMATION

[75] Inventors: Hideo Taniguchi, Kyoto; Hiromi Ogata, Mudou; Kensuke Sawase, Takarazuka; Manabu Yokoyama, Kyoto; Munekazu Tujikawa, Shiga, all of Japan

[73] Assignee: Rohm Co., Ltd., Kyoto, Japan

[21] Appl. No.: 367,750

[22] Filed: Jun. 19, 1989

[30] Foreign Application Priority Data

| Jun. 21, 1988 | [JP] | Japan | 63-152582 |
| Jul. 8, 1988 | [JP] | Japan | 63-171482 |
| Jul. 8, 1988 | [JP] | Japan | 63-171483 |
| Jul. 8, 1988 | [JP] | Japan | 63-171484 |
| Jul. 21, 1988 | [JP] | Japan | 63-096705[U] |

[51] Int. Cl.$^5$ .............................................. H01J 40/14
[52] U.S. Cl. ................................. 250/208.1; 358/494
[58] Field of Search ............... 250/208.1, 216, 578.1; 358/482, 483, 494

[56] References Cited

U.S. PATENT DOCUMENTS

| 4,114,037 | 9/1978 | Westwood | 250/216 |
| 4,539,482 | 9/1985 | Nose | 250/208.1 |
| 4,550,249 | 10/1985 | Damen et al. | 250/208.1 |
| 4,639,127 | 1/1987 | Beery et al. | 250/208.1 |

FOREIGN PATENT DOCUMENTS

| 60-15622 | 1/1985 | Japan . |
| 62-62322 | 3/1987 | Japan . |

Primary Examiner—David C. Nelms
Assistant Examiner—Stephone B. Allen
Attorney, Agent, or Firm—William H. Eilberg

[57] ABSTRACT

An apparatus for optically writing information comprises a row of longitudinally spaced LED array chips, a photosensitive surface arranged to face the chip row in parallel thereto, and a lens system arranged between the chip row and the photosensitive surface. Each array chip has constantly spaced LEDs to provide luminescent dots. The lens system includes convex lens elements arranged in corresponding relation to the respective array chips to form magnified images, in inverted arrangement, of the luminescent dots of the respective array chips on the photosensitive surface, so that all of the dot images on the photosensitive surface are constantly spaced.

14 Claims, 16 Drawing Sheets

Fig. 2
Fig. 3
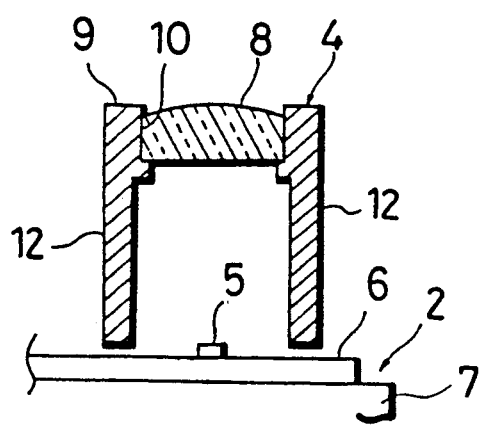
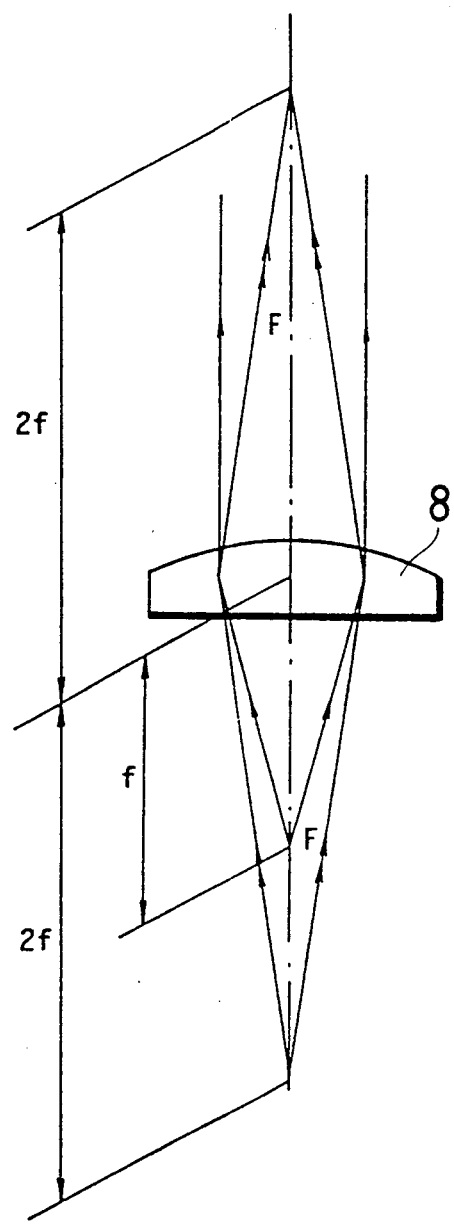

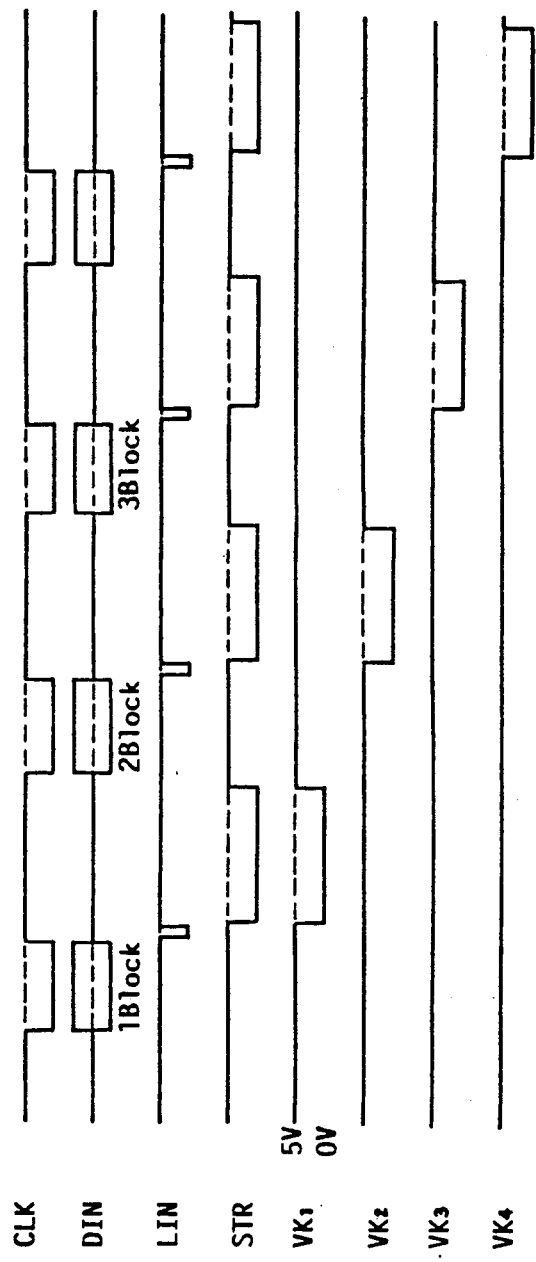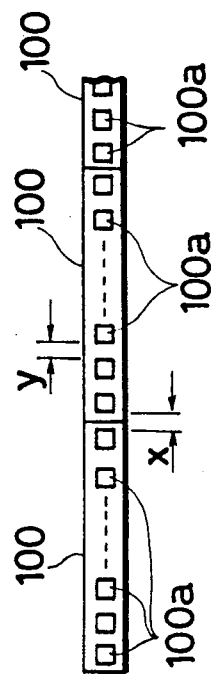

APPARATUS FOR OPTICALLY WRITING INFORMATION

BACKGROUND OF THE INVENTION

1. Field of the invention

This invention relates to an apparatus, such as an optical printer, for optically writing information. The invention also relates to an apparatus, such as an optical image reader, for optically detecting or reading information.

2. Description of the Prior Art

Generally, optical printers include a row of light emitting diodes (LED) arranged to face a photosensitive drum in parallel thereto, and a lens system arranged between the diode row and the drum. The row of diodes, when driven for lighting, forms a row of luminescent dots in various patterns depending on the driving control. The lens system serves to form an image of the luminescent dot row on the drum in rotation, thus effecting intended printing in accordance with the driving control.

Most commonly, the lens system for the optical printer is constituted by an array of self-focusing microlenses commercially available for example from NIPPON SHEET GLASS CO., LTD. The array of self-focusing microlenses is designed and arranged to form an actual size image of a luminescent dot row on the photosensitive drum without image inversion. In other words, the dot image row on the photosensitive drum exactly corresponds in size and dot arrangement to the actual luminescent dot row. Therefore, in order to conduct correct printing with high quality, it is necessary to arrange the LEDs at constant minute spacing throughout the entire length of the LED row.

As shown in FIG. 23 of the accompanying drawings, on the other hand, the LED row, which can be very long in some applications, is constituted usually by arranging a plurality of LED array chips 100 in intimate end-to-end contact with each other. Each array chip 100 incorporates an array of LEDs 100a at constant minute spacing. Thus, the spacing y between each two adjacent LEDs 100a within each single array chip 100 must be exactly equal to the spacing x between two adjacent end LEDs of two different array chips in order to make the dot spacing constant over the entire length of the LED row, as required to ensure high printing quality. However, it is in fact virtually impossible to satisfy this spacing requirement for the following reasons.

First, in manufacture of LED array chips, each unit chip is diced or cut from a long wafer carrying a number of LEDs. However, inevitable limitations on dicing accuracy result in that a dot spacing irregularity occurs at the position where each two adjacent array chip 100 are held in intimate end-to-end contact. An attempt to increase the dicing accuracy to an acceptable level, on the other hand, will lead to an unacceptable cost increase.

Second, a similar spacing irregularity also occurs due to mounting errors in bonding the array chips onto a substrate. Further, mounting the array chips in intimate end-to-end contact inherently involves the risk of arrangement disorder, chip damaging and chip contamination.

In this way, the prior art optical printer incorporating the row of constantly spaced LEDs and the array of self-focusing microlenses is disadvantageous in the difficulty of ensuring high printing quality. Further, the prior art printer is also disadvantageous in that the self-focusing microlens array is relatively expensive.

Obviously, the problems discussed above hold with respect to conventional optical image sensors or readers wherein a plurality of sensor array chips are arranged in a row so that all image sensing elements (light receiving elements) are constantly spaced over the entire length of the chip row.

SUMMARY OF THE INVENTION

It is, therefore, an object of the present invention to provide an apparatus for optically writing information, particularly an optical printer, which ensures a high printing quality without requiring strict accuracy for chip dicing and bonding.

Another object of the present invention is to provide an apparatus for optically detecting information, particularly an optical image sensor, which ensures a high sensing reliability without requiring strict accuracy for chip dicing and bonding.

A further object of the present invention is to provide an improved lens system to be advantageously incorporated into the optical printer or reader.

Still another object of the present invention is to provide a preferable conductor arrangement to be employed for the optical printer, particularly for an LED print head incorporated in the optical printer.

Still another object of the present invention is to provide a circuit arrangement which is suitable for driving the optical printer at high speed without requiring any modification in data feeding method.

Still further object of the present invention is to provide a circuit arrangement which is suitable for uniformly driving the optical printer even if there are property variations between various control ICs for separately driving the respective LED array chips.

Still further object of the present invention is to provide an improved circuit arrangement for matrix control wherein all LED array chips are driven time-divisionally by a single control IC to enable less costly operation of the optical printer.

According to one aspect of the present invention, there is provided an apparatus for optically writing information comprising: at least one row of LED array chips arranged as spaced from each other along the chip row, each array chip including a plurality of light emitting diodes constantly spaced along the chip row to provide luminescent dots; a photosensitive surface arranged in facing relation to the row of LED array chips in parallel thereto; and a lens system disposed between the photosensitive surface and the row of LED array chips, the lens system including a row of convex lens elements arranged in corresponding relation to the row of LED array chips, the distance between the row of convex lens elements and the row of LED array chips being larger than the focal length (f) of each lens element but less than double the focal length so that images of the luminescent dots of each LED array chip are formed on the photosensitive surface in an inverted and magnified arrangement, the magnification of the respective convex lens elements being such that all of the dot images on the photosensitive surface are constantly spaced without image overlapping.

According to another aspect of the present invention, there is provided an apparatus for optically detecting information comprising: at least one row of sensor array chips arranged as spaced from each other along the chip row, each array chip including a plurality of light receiving elements constantly spaced along the chip row; an image surface arranged in facing relation to the row of sensor array chips in parallel thereto, the image surface providing an overall effective width divided into unit array width portions which correspond in number to the sensor array chips and are constantly spaced from each other, each unit width portion containing picture element width portions which are arranged at a constant pitch and correspond in number to the light receiving elements of the corresponding sensor array chip, the pitch being equal to the spacing between the unit width portions; and a lens system disposed between the image surface and the row of sensor array chips, the lens system including a row of convex lens elements arranged in corresponding relation to the row of sensor array chips, the distance between the row of convex lens elements and the row of sensor array chips being larger than the focal length (f) of each lens element but less than double the focal length, each lens element functioning to provide image reduction and inversion so that the distance between the farthest picture element width portions within the corresponding unit array width portion exactly corresponds to the distance between the farthest light receiving elements within the corresponding sensor array chip.

Other objects, features and advantages of the present invention will be fully understood from the following detailed description given with reference to the accompanying drawings.

BRIEF DESCRIPTION OF THE DRAWINGS

In the accompanying drawings:

FIG. 2 is a sectional view taken on lines II—II in FIG. 1;

FIG. 3 is a view illustrative of an lens arrangement;

FIGS. 22a and 22b are timing charts for the matrix control of the optical printer; and FIG. 23 is a schematic view showing an array chip arrangement according to the prior art.

DETAILED DESCRIPTION

Figure 1:
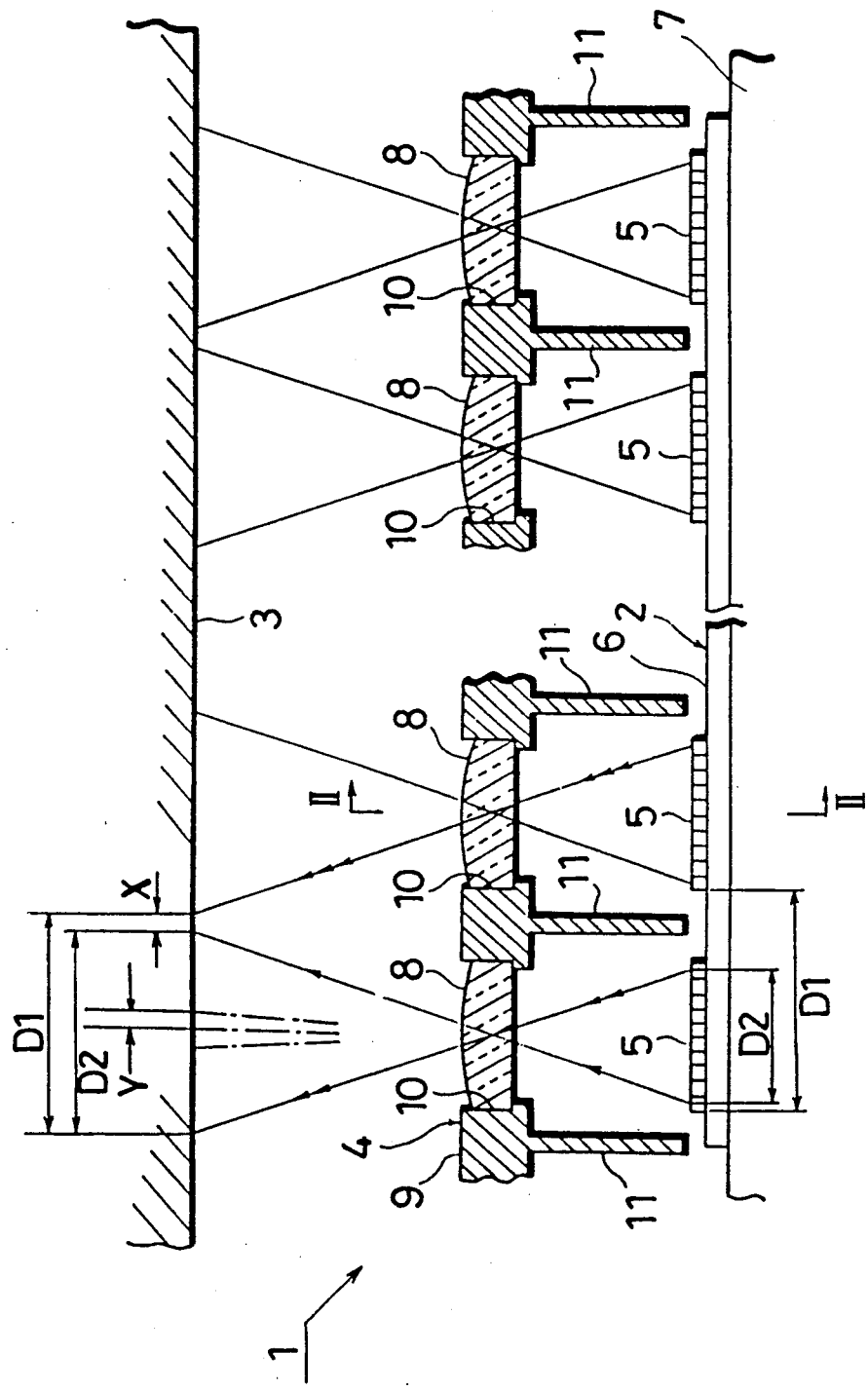
FIG. 1 is a schematic view, in longitudinal section, showing an optical printer embodying the present invention.

Referring now to FIGS. 1 and 2 of the accompanying drawings, there is illustrated an optical printer 1 which comprises an LED print head 2 arranged in facing relation to a photosensitive drum 3 in parallel thereto. A lens system 4 is disposed between the print head and the drum.

The LED print head 2 includes a plurality (e.g. 16) of LED array chips 5 fixed in a longitudinal row on a substrate 6 as constantly spaced from each other. Each chip 5 comprises a plurality (e.g. 64 or 128) of light emitting diodes disposed at constant minute spacing in a longitudinal array on a strip-form GaAsP wafer of a rectangular cross-section. When lit, each diode forms a luminescent dot. The print head further includes a heat sink 7 for preventing excessive heating of the LED array chip and the substrate.

In manufacture, a single wafer having a large length is cut into chip lengths by dicing to provide a number of LED arrays chips at one time.

The spacing between the array chips 5, which is constant, is determined in dependence on the magnification provided by the lens system 4. On the other hand, the spacing between the luminescent dots in each chip 5 is fixed irrespective of the magnification of the lens system.

The distance between the print head 2 and the drum 3 is also determined by the characteristic and arrangement of the lens system 4.

The lens system 4 includes a plurality of convex lenses 8 arranged in exact correspondence with the respective array chips 5. Thus, the pitch between the lenses is exactly the same as that between the array chips. Each lens may be aspherical and made of a hard resinous material to have little or negligible aberration.

The lenses 8 are retained in place by an elongated lens holder 9 formed with lens holding bores 10 in exact correspondence with the array chips 5. The lens holder may be supported at both longitudinal ends (not shown in FIGS. 1 and 2) on the heat sink 7 in a manner such that the holder is minutely adjustable in level. The holder may be made either of a synthetic resin or a metal.

The lens holder 9 is formed with light shielding partition walls 11 each extending toward a point between two adjacent array chips 5. Further, the holder has a pair of light shielding longitudinal walls 12. Thus, each array chip is substantially enclosed in a box space, so that the light from that particular chip will not leak into adjacent box spaces. Such light shielding serves to prevent deterioration in printing quality.

In accordance with the present invention, the lens system 4 is arranged so that the distance between each lens 8 and the corresponding array chip 5 (object point) is larger than the focal length (f) of the lens but smaller than 2f (see FIG. 3). With this arrangement, real images of the luminescent dots are formed on the opposite side of the lens, but the image point is located farther from the lens than the object point. In other words, the lens serves to form magnified images, in inverted arrangement, of the luminescent dots at the image point. The photosensitive drum 13 is located so that its image receiving surface is located at the image point.

As shown in FIG. 1, the pitch between two adjacent chips 5 is represented as D1, whereas the distance between the two end dots (farthest dots) in each chip is denoted as D2. Further, the distance between the two end dot images of the same chip is represented as D2', whereas the spacing between two adjacent dot images of the same chip is designated as Y. Obviously, the distance between the images of two corresponding dots (correspondingly located or numbered dots) of two adjacent chips is always equal to D1 regardless of the magnification provided by the lenses 8. Represented by reference character X is the spacing between nearest two end dot images of each two adjacent chips.

According to the present invention, the magnification of the lenses 8, which is defined as D2'/D2, is set to satisfy the following equation.

$$D2'/D2 = (D1-Y)/D2$$

From the above equation, it is understood that $D2' = D1 - Y$, so $Y = D1 - D2' = X$. In this way, it is possible to ensure constant spacing between all dot images even when each two adjacent chips 5 are reasonably spaced, as illustrated in FIG. 1. The lens holder 9 may be minutely adjusted in level within a range of allowable image blurring, thereby making the dot image spacing X exactly equal to Y.

According to the present invention, there is no need to arrange the respective array chips 5 in end-to-end contact with each other. Therefore, strict dicing accuracy is no longer called for when manufacturing a number of array chips from a long wafer. As a result, the dicing step is much more simplified while drastically increasing the yield of production. Further, the reasonable spacing between the chips 5 reduces the likelihood of damaging or contaminating contact between them during chip bonding, thereby facilitating the bonding operation and ensuring a higher quality of the print head 2.

The convex lenses 8 can be manufactured at a lower cost than the self-focusing microlenses which are currently in wide use. There has been established a technique for accurately manufacturing aspheric plastic lenses with little aberration. Thus, it is possible to enhance the quality of the optical system 4 to a sufficient extent for providing good printing quality.

The provision of the lens holder 9 having level adjustability facilitates accurate mounting or positioning of the lenses 8. Further, the light shielding partition walls 11 serve as reinforcing ribs to prevent deformation of the holder in addition to preventing light leakage, thereby contributing greatly to retention of good printing quality.

Figure 4:
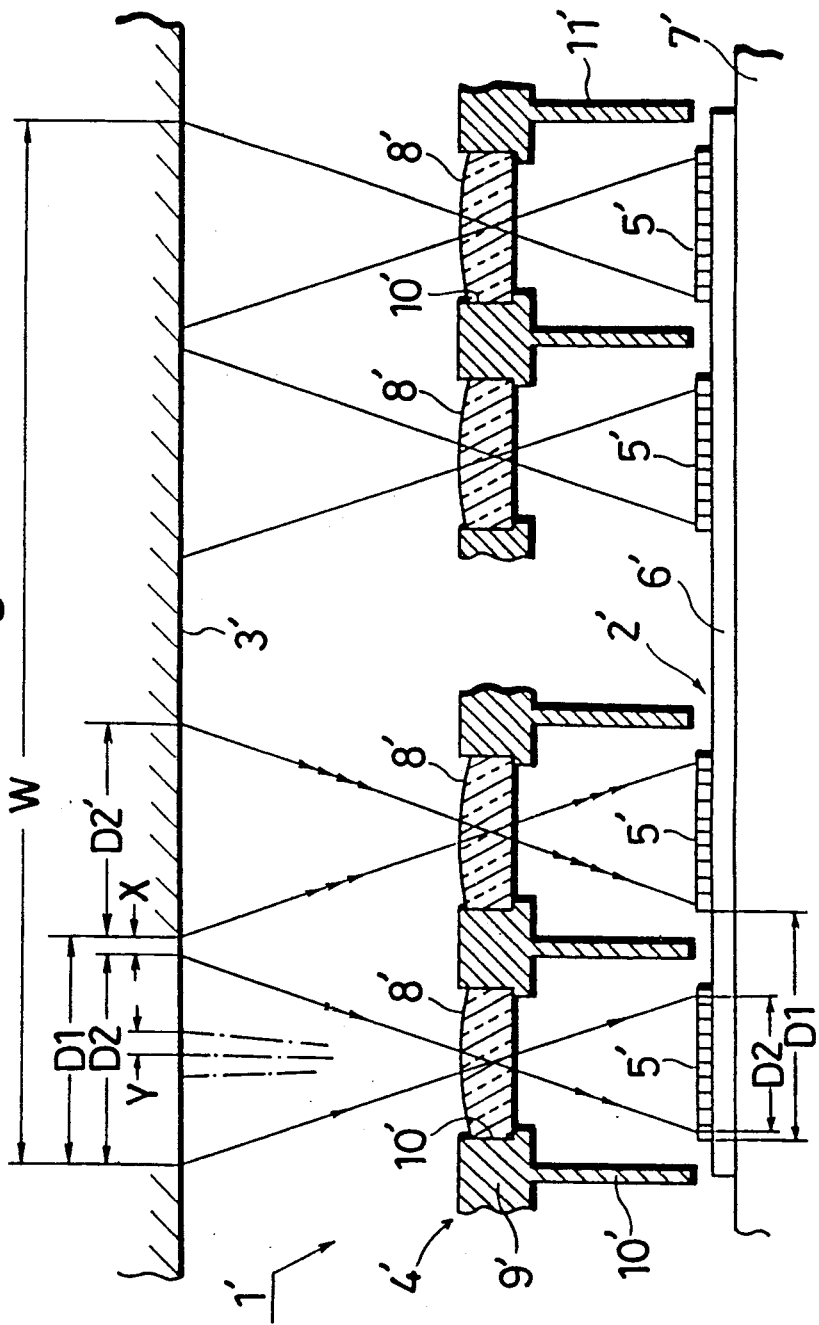
FIG. 4 is a schematic view similar to FIG. 1 but showing an optical reader also embodying the present invention.

FIG. 4 shows an apparatus for optically reading or detecting information according to another embodiment of the present invention. The optical reader 1' comprises a reading head 2' disposed in parallel to an image surface 3' to be detected. A lens system 4' retained by a lens holder 9' is arranged between the reading head and the image surface.

The reading head 2' includes a plurality (e.g. 16) of sensor array chips 5' arranged in a longitudinal row on a substrate 6' as constantly spaced from each other. Each sensor array chip comprises a plurality (e.g. 64 or 128) of light receiving elements, such as phototransistors, arranged at constant minute spacing in an array on a unit wafer which may be diced from a longer wafer.

The lens holder 9' having lens holding bores 10' and light shielding partition walls 11' retains aspheric convex lenses 8' in exactly corresponding relation to the respective array chips 5'. The arrangement and magnification of the lens system 4' may be determined in relation to the chips 5' and the image surface 3' in substantially the same manner as previously described in connection with the optical printer 1 (FIG. 1). However, it should be appreciated here that the image surface 3' is located at the object point of each lens 8', whereas each chip 5' is located at the image point. Thus, an image on the surface 3' is reduced when recognized by the sensor chips 5'.

According to the arrangement shown in FIG. 4, the image surface 3' provides an overall effective width W which is divided into unit array width portions D2' corresponding in number to the sensor array chips 5', a constant spacing X being formed between each two adjacent unit array width portions D2'. Further, each unit width portion D2' is equally subdivided into picture element width portions corresponding in number to the light receiving elements of each sensor array chip 5'. The pitch Y between each two adjacent picture element width portions is equal to the spacing X described above. The image reduction provided by each convex lens 8' is such that the distance between the two farthest picture element width portions within each unit array width portion exactly corresponds to the distance between the two farthest light receiving elements within each sensor array chip 5'. Thus, by virtue of the image reduction provided by the convex lens system 4', the entirety of an image or images contained within the overall effective width W can be scanned at constant minute pitch Y (equal to X) by the photosensors of the respective chips 5' even if the chips are longitudinally spaced as illustrated.

In either of the optical printer 1 and the optical reader 1', the convex lens system 4, 4' serves to form an inverted image with respect to each of the respective array chips 5, 5'. Thus, in order to make a normal printing or reading, it is necessary to feed serial data or signals to each chip 5, 5' in reverse order. Such reverse data feeding will be explained hereinafter in connection with the optical printer.

In FIGS. 1 and 4, the convex lenses 8, 8' are all separate and individually retained in place by the lens holder 9. Alternatively, a single lens array plate having a required number of integral lens portions may be used. Further, a plurality of lens array plates each having a plurality of integral lens portions may be used in combination to provide a required number of lens portions.

Figure 5:
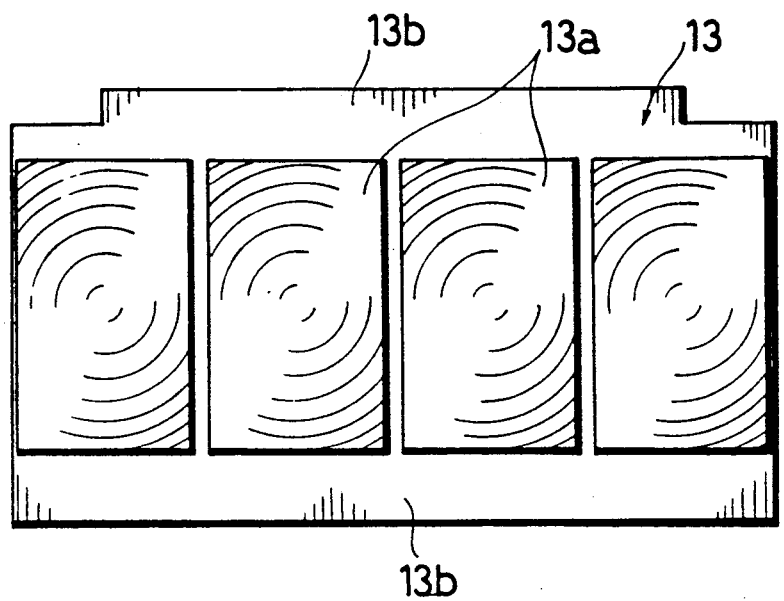
FIG. 5 is a plan view showing a lens array plate useable in the printer of FIG. 1 or the reader of FIG. 4.
Figure 6:
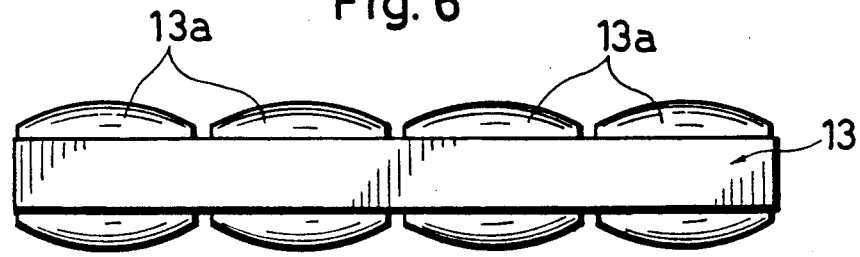
FIG. 6 is a front view of the lens array plate shown in FIG. 5.

In FIGS. 5 and 6, there is shown an example of lens array plate 13. The lens array plate is generally rectangular in plan view, and has four integral lens portions 13a which are also rectangular in plan view. The lens portions 13a are shown as distinctly spaced longitudinally of the plate. The lens array plate further has a pair of longitudinal margins 13b which are used for mounting purposes, as described later. Preferably, the lens array plate is made of a plastic.

In assembly, four of such lens array plates 13 for example are used in combination to provide sixteen lens portions 13a in total. Alternatively, the lens array plate may be modified to have sixteen integral lens portions. Obviously, the use of such a lens array plate or plates simplifies the construction, and facilitates assembly.

Figure 7:
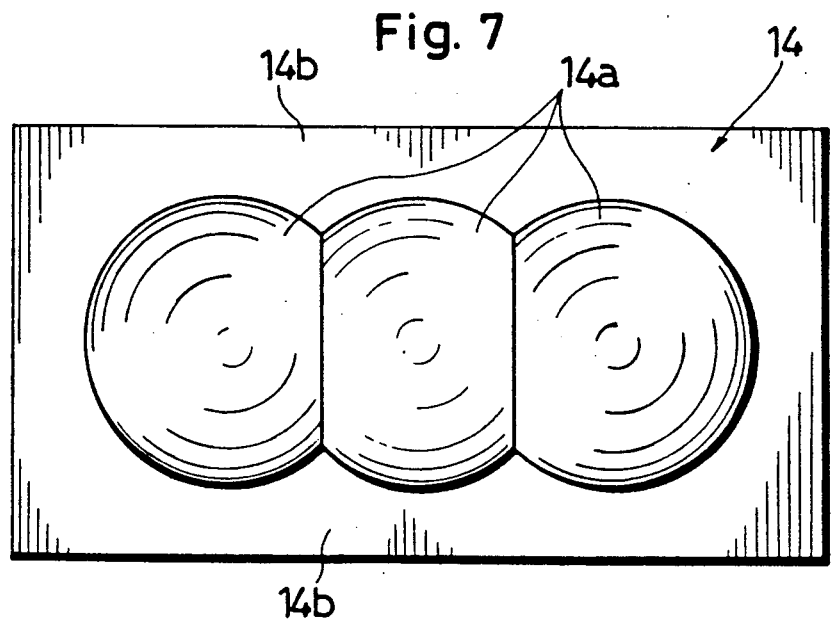
FIG. 7 is a plan view similar to FIG. 5 but showing another lens array plate.
Figure 8:
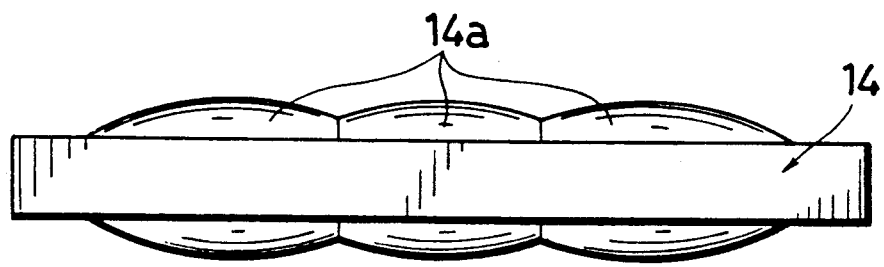
FIG. 8 is a front view of the lens array plate shown in FIG. 7.

FIGS. 7 and 8 show another lens array plate 14 which has three integral lens portions 14a, and a pair of longitudinal margins 14b for mounting purposes. As opposed to the example shown in FIG. 5, the lens portions 14a have round configuration in plan view, and merges with each other.

Figure 9:
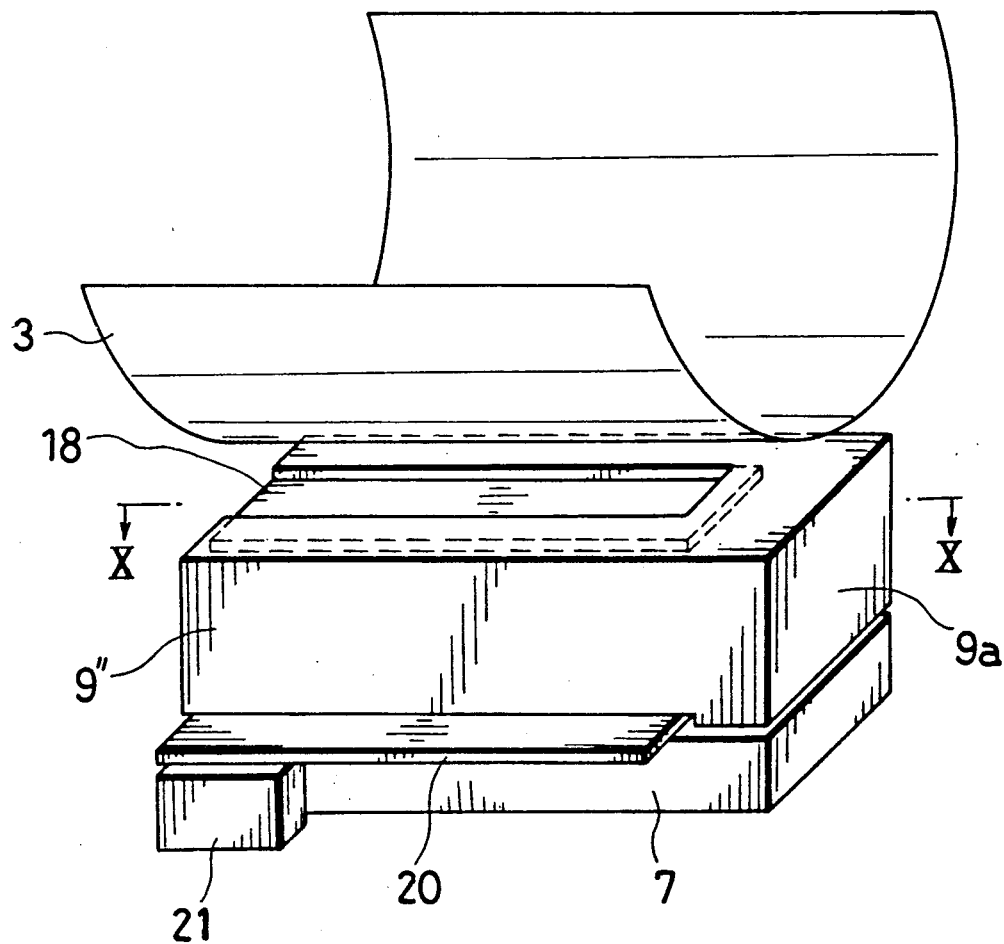
FIG. 9 is a perspective view showing another optical printer using a modified lens holder.
Figure 10:
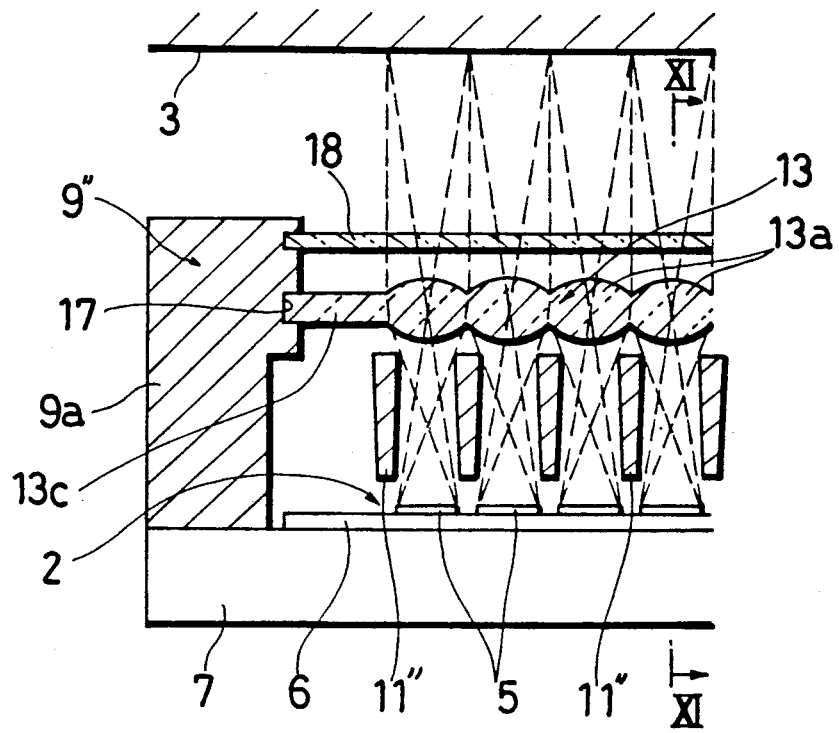
FIG. 10 is a sectional view taken on lines X—X in FIG. 9.
Figure 11:
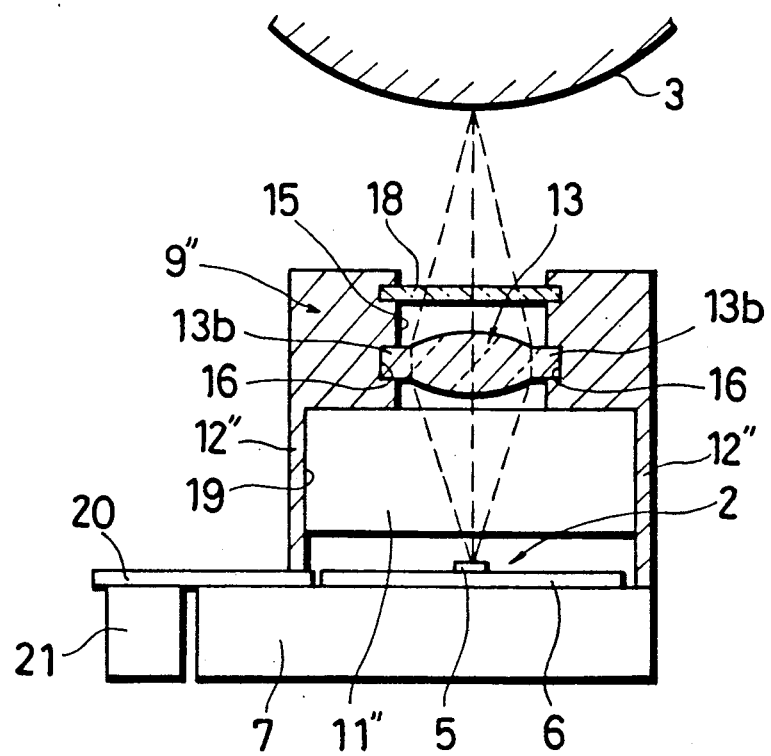
FIG. 11 is a sectional view taken on lines XI—XI in FIG. 10.

The lens array plate or plates 13 (or 14) described above may be advantageously held in place by an elongate lens holder or housing 9" shown in FIGS. 9 to 11. More specifically, the lens holder 9" has an upper longitudinal opening 15 which is rectangular in plan view. The longitudinal opening 15 is formed with a pair of longitudinal grooves 15a for receiving the longitudinal margins 13b of the lens array plate 13. Preferably, the lens array plate or a terminal lens array plate has an elongated end portion 13c which is anchored in a corresponding transverse groove 17 at each end of the holder. Thus, the lens array plate is prevented from displacing in any direction relative to the lens holder.

Above the lens array plate 13 is arranged a transparent guard plate 18 which is preferably made of an acrylic resin. The guard plate may be mounted to the lens holder 9" in a manner similar to the lens array plate. The guard plate serves to prevent entry of foreign substances such as dust, thereby protecting the lens array plate and other important components against contamination and damages.

The lens holder 9" has a lower interior space 19 defined by a pair of longitudinal walls 12" and a pair of end walls 9l (only one shown). The interior space is separated by a plurality of light shielding partition walls 11" extending transversely of the holder. These partition walls serve to prevent undesirable light leakage, as already described.

In FIGS. 9 and 10, the end walls 9a of the lens holder 9" are shown to be supported on the heat sink 7 of the LED print head 2. Indicated at 20 is a printed circuit board, and at 21 an electrical connector. The lens holder 9" may be made of a synthetic resin, whereas the heat sink may be made of a heat conducting metal such as aluminum. The holder may also be made of a metal such as aluminum, thereby assisting heat dissipation provided by the heat sink.

Figure 12:
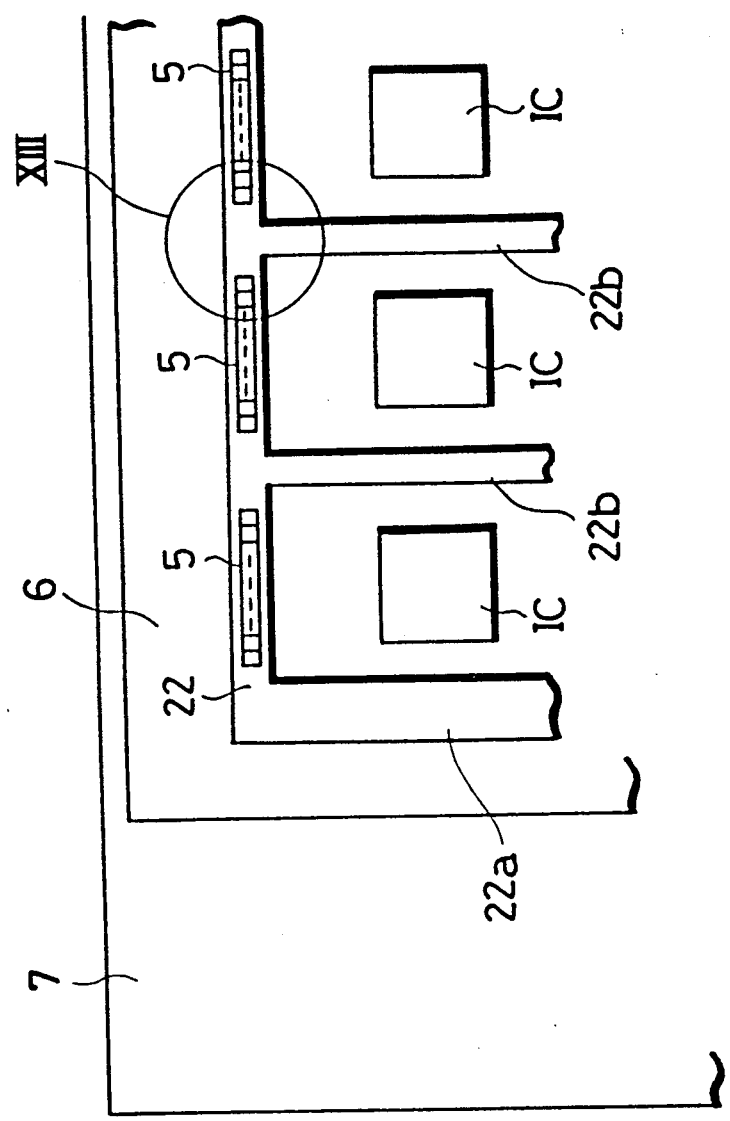
FIG. 12 is a plan view showing a conductor pattern for the optical printer of FIGS. 1 or 9.
Figure 13:
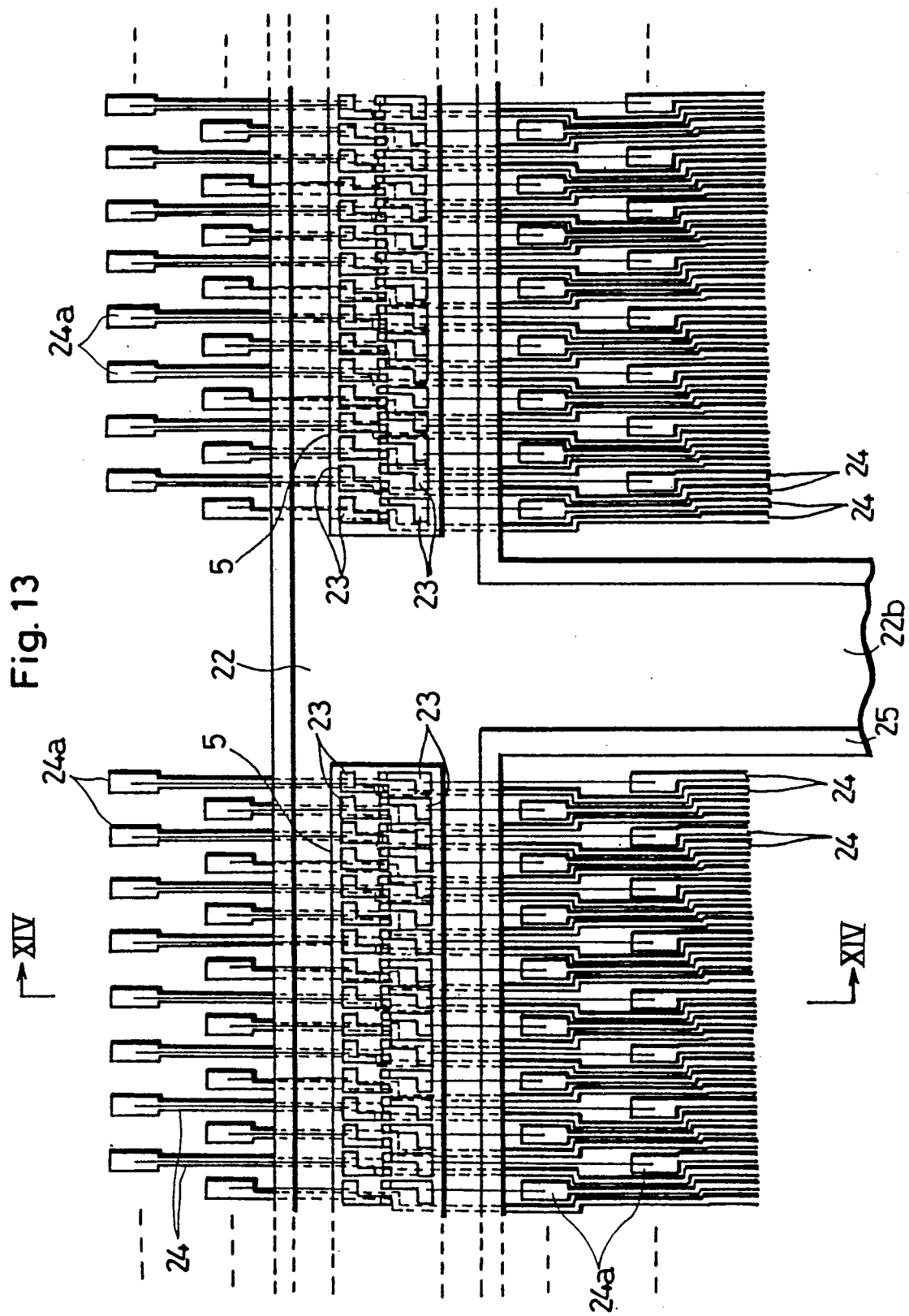
FIG. 13 is an enlarged plan view showing a portion XIII in FIG. 12.
Figure 14:
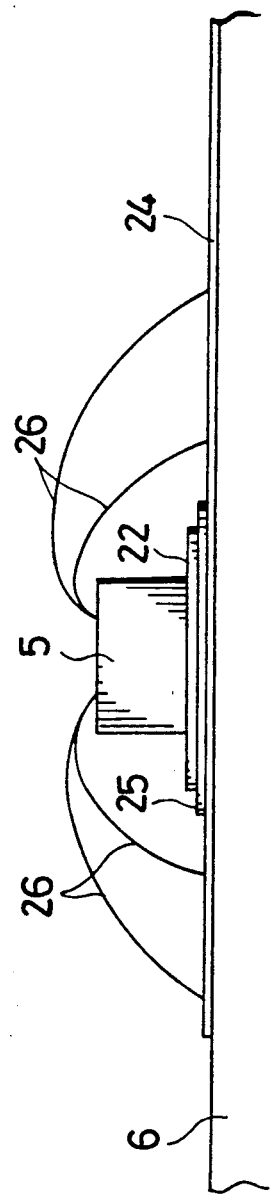
FIG. 14 is a sectional view taken on lines XIV—XIV in FIG. 13.

FIGS. 12 to 14 show a conductor arrangement on the substrate 6. The conductor arrangement includes a common cathode strip 22 formed at each end with a terminal lead 22a for grounding. Each LED array chip 5 incorporating an array of light emitting diodes is mounted on the cathode strip 22 with the cathode of each diode held in conduction therewith. The chip carries anode pads 23 disposed in a staggered arrangement on both sides of the diode array, each pad being held in conduction with the anode of a corresponding diode. Such a staggered arrangement of the anode pads are necessary because the diode array density is very high.

The conductor arrangement further includes a pattern of anode leads 24 extending on the substrate 6 for connection to relevant control circuits IC (FIG. 12) which are provided for separately driving the respective array chips 5. Again due to the high density of the diode array, the anode leads have enlarged connection ends 24a located on both sides of the cathode strip 22. Thus, a half number of the anode leads must extend under and across the cathode strip 22 with an insulation layer 25 interposed between the cathode strip and the anode leads, as better illustrated in FIG. 14. The connection ends of the anode leads are connected to the respective anode pads 23 through wires 26.

According to the present invention, there is a sufficient spacing between each two adjacent array chips 5. Therefore, this spacing can be utilized to branch out, from the common cathode strip 22, an auxiliary cathode lead 22b for grounding. According to the prior art wherein all array chips are disposed in end-to-end contact with each other, it is difficult to provide such a branching cathode lead because of densely arranged anode leads hindering to do so.

The common cathode strip 22 must be made long when a large number to LED array chips are used to provide a large printing width. If the cathode strip 22 has no auxiliary grounding lead, the internal resistance of the cathode strip becomes non-negligible with respect to those array chips 5 which are located away from the terminal grounding lead 22a. In some cases, the intermediately positioned array chips may suffer a brightness drop of 10–20% due to the increased internal resistance of the cathode strip.

The auxiliary cathode leads 22b serve to prevent a brightness drop with respect to all array chips 5 by separately grounding them though shortest possible paths. If desired, such an auxiliary cathode lead may be provided only with respect to one array chip 5 which is located farthest from the terminal cathode lead 22a.

Figure 15:
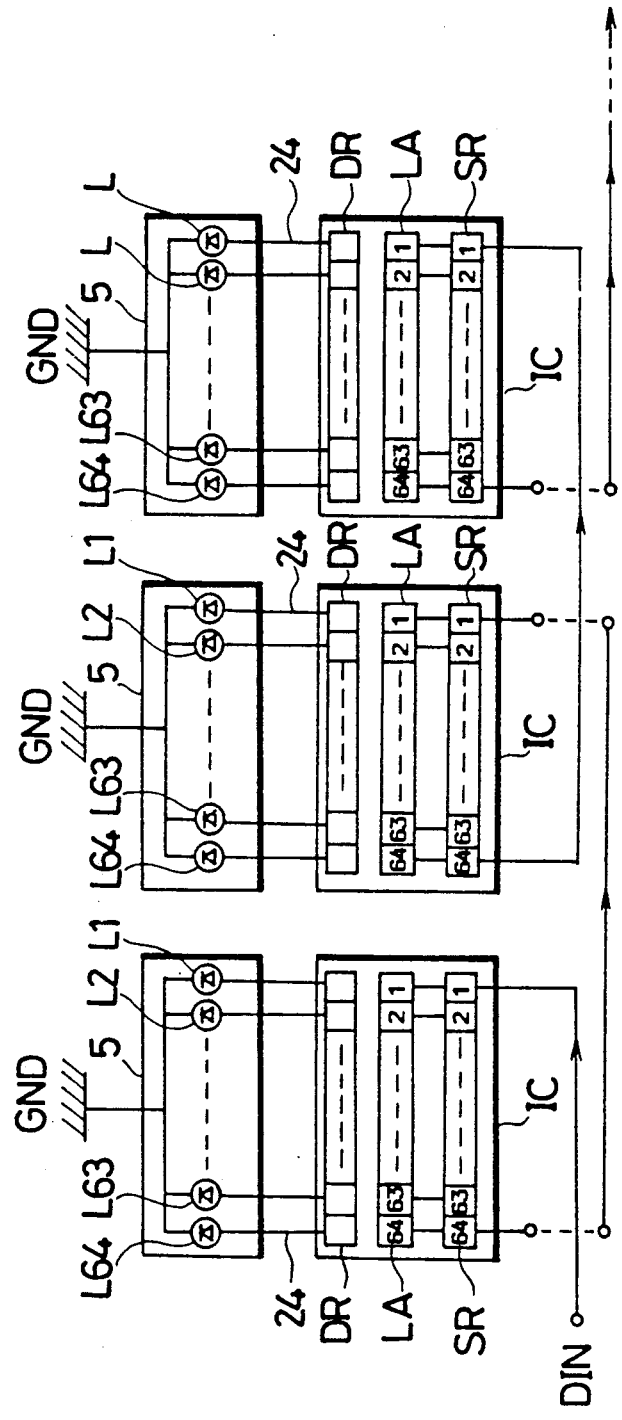
FIG. 15 is a block diagram showing control circuits for driving the optical printer of FIGS. 1 or 10.

As previously described in connection with FIG. 1, each lens 8 forms an inverted image, on the photosensitive drum 3, of the luminescent dot arrangement of a corresponding LED array chip 5. Thus, some measure must be taken to compensate for such image inversion in order to carry out correct printing. A first solution is to feed serial control signals in reverse order to each control circuit IC (FIG. 2). A second solution is to feed serial control signals in normal order to the control circuit wherein the signal series is registered in reverse order. FIG. 15 illustrates the second solution.

In FIG. 15, each LED array chip 5 is shown to incorporate an array of light emitting diodes L1–L64. Each control circuit IC comprises a shift register SR, a latch circuit LA and a drive circuit DR. The shift register SR has memory cells corresponding in number to the diodes of the chip for receiving a relevant series of data. The latch circuit LA has latch cells for parallel latching of the registered serial data upon reception of a latch signal. The drive circuit DR, which is connected to the anodes of the respective diodes L1–L64 via the anode leads 24, functions to supply the latched data to the diodes upon reception of a strobe signal.

According to the arrangement shown in FIG. 15, each shift register SR is oriented reversely to the data transmitting direction between each two adjacent shift registers, so that the serial data supplied in normal order are registered in reverse order. More specifically, the data transmission between the two adjacent shift registers SR occurs in the rightward direction in FIG. 15, whereas the data shifting within the single shift register SR occurs in the leftward direction. For this purpose, the last memory cell (numbered 64) of the first shift register (the lefthand register in FIG. 15) is connected in series to the first cell (numbered 1) of the second shift register, and the last cell of the second shift register is connected in series to the first cell of the third shift register, such connection being repeated up to the last shift register (not shown).

By using the control circuit arrangement shown in FIG. 15 in combination with the print head 1 shown in FIG. 1, it is possible to conduct correct printing in spite of the image inversion provided by the convex lens system 4. In so doing, the serial data input per se may be carried out in normal order because data reversal is realized by reverse orientation of the shift register SR within each control circuit IC.

Figure 16:
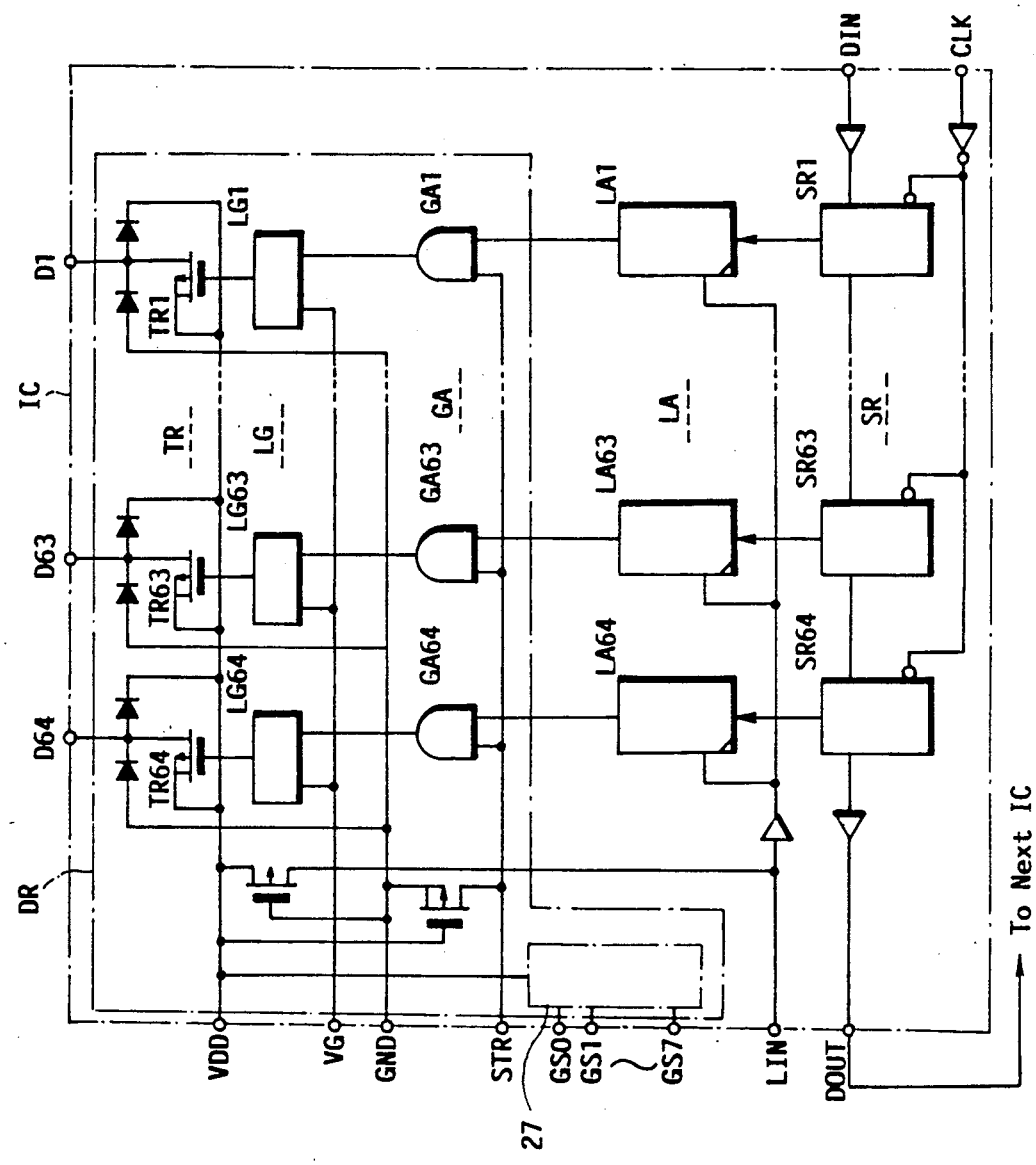
FIG. 16 is a block diagram representing more details with respect to each of the circuits shown in FIG. 15.

FIG. 16 illustrates a more specific circuit arrangement for each control circuit IC. The shift register SR of the control circuit is again shown to include memory cells SR1-SR64 arranged to store, in reverse order, the serial data supplied in normal order though a data input terminal DIN, as previously described. The latch circuit LA includes latch cells LA1-LA64 for parallel latching of the registered data of the shift register upon feeding of a latch signal through a latch terminal LIN. It should be noted that the memorized or latched data are "1" for those cells corresponding to the LEDs (FIG. 15) to be lit, whereas the data are "0" for those cells corresponding to the LEDs not to be lit.

According to the example illustrated in FIG. 16, the control circuit DR includes a gate circuit GA, a logic circuit LG, a drive transistor circuit TR, and a gate voltage setting circuit 27.

The gate circuit GA comprises AND gates GA1--GA64. When a strobe signal is fed through a strobe terminal STR, each AND gate produces a high or low output "1" or "0" depending respectively on the "1" or "0" state of the corresponding latch cell.

The logic circuit LG incorporates logic gates LG1-LG64, whereas the drive transistor circuit comprises MOSFETs (metal oxide Semiconductor field effect transistor) TR1-TR64 whose output terminals D1-D64 are connected to the respective LEDs L1-L64 (FIG. 15). Each logic gate functions to apply a gate voltage VG to the gate of the corresponding MOSFET in response to the "1" output from the corresponding AND gate. As a result, a voltage equal to a difference between the gate voltage VG and a source voltage VDD is applied across the MOSFET for activation thereof, thereby lighting the corresponding LED L1-L64 (FIG. 15) for intended printing. On the other hand, a voltage equivalent to the source voltage VDD is produced by the logic gate in response to the "0" output from the AND gate, so that the MOSFET remains inactive.

As is known, the drive current passing through the LEDs L1-L64 of each array chip 5 (FIG. 15) varies depending on the magnitude of the gate voltage VG and the characteristic of the corresponding control circuit IC. Thus, in order to equalize the average brightness of each LED with respect to all of the array chips 5, it is necessary to adjust the gate voltage VG separately with respect to all of the control circuits IC.

A conventional way for such voltage adjustment is to provide a voltage dividing circuit arranged outside each control circuit IC for applying an adjusted gate voltage. More specifically, the voltage dividing circuit enables voltage adjustment through changing the voltage division ratio by selecting resistors to be incorporated into the circuit. However, according to this manner of voltage adjustment, it is difficult to minutely adjust the gate voltage because there is a limitation on the kinds of available resistors. Further, this manner of voltage adjustment is time-taking.

Figure 17:
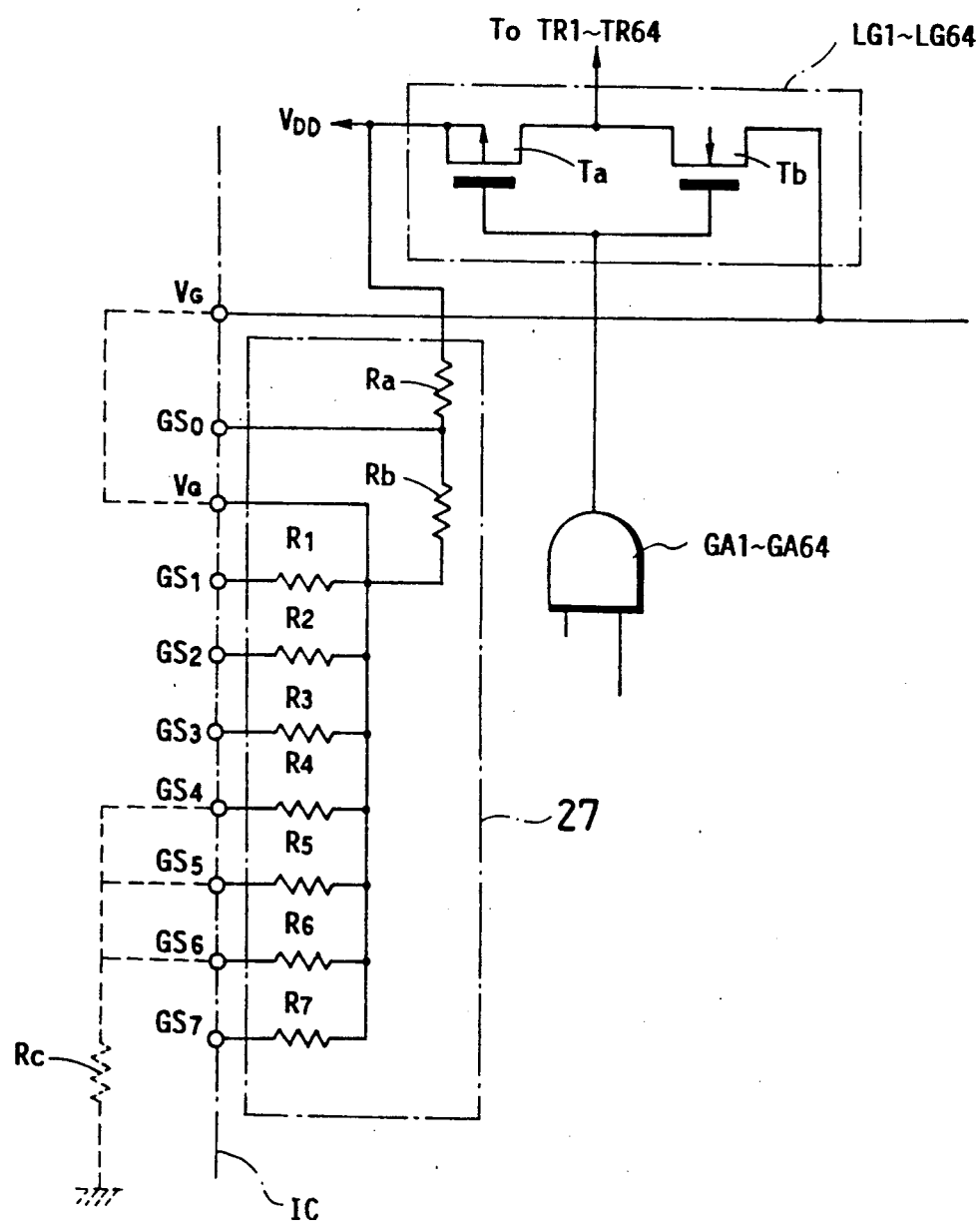
FIG. 17 is a circuit diagram showing a gate voltage setting circuit incorporated in the control circuit shown in FIG. 16.

According to the arrangement shown in FIG. 16, the gate voltage setting circuit 27 incorporated into the drive circuit DR of each control circuit enables minute voltage adjustment with ease. FIG. 17 represents the detailed arrangement of the gate voltage setting circuit.

As shown in FIG. 17, the gate voltage setting circuit 27 comprises a first group of series resistors Ra, Rb, and a second group of parallel resistors R1-R7. The resistor Ra in the first group is connected to the voltage source VDD, and an intermediate position between the two resistors Ra, Rb is connected to a terminal GS0. The resistors R1-R7 in the second group are connected commonly to the resistor Rb in the first group, but separately to grounding terminals GS1-GS7. The connection between the first resistor group and the second resistor group is further connected to the gate voltage supply terminal VG. Assuming now that the resistivity of the resistor R1 is taken as R (i.e. R1=R), the relative resistivities of the respective resistors may be set as follows.

| | | | |
|---|---|---|---|
| Ra = 1.6 R | Rb = 1.9 R | R1 = 1.0 R | R2 = 1.6 R |
| R3 = 2.2 R | R4 = 2.8 R | R5 = 3.4 R | R6 = 4.0 R |
| R7 = 4.5 R | | | |

In use, selected three for example of the grounding terminals GS1-GS7 are commonly grounded through a common grounding resistor Rc, as illustrated in FIG. 17. The gate voltage terminal VG is connected to the gate input of each logic gate LG1-LG64.

According to the arrangement of FIG. 17, the gate voltage VG is determined by voltage division of the source voltage VDD which is provided by the first group resistors Ra, Rb, the selected three of the second group resistors R1-R7, and the common grounding resistor Rc. The second group resistors R1-R7, seven according to the illustrated example, provide various combinations (thirty five combinations) for selecting three of them. Thus, it is possible to minutely adjust the gate voltage VG, thereby enabling all of the control circuits IC to uniformly drive the respective LED array chips 5 (FIG. 15) even if there are variations in the characteristic of the individual control circuits. Further, the gate voltage setting circuit 27 utilizes only a limited number of second group resistors in an identical arrangement for each control circuit, but yet provides various resistor combinations to enable minute voltage adjustment. Apparently, this is much more advantageous than the prior art which requires various kinds of resistors for intended adjustment.

Figure 18:
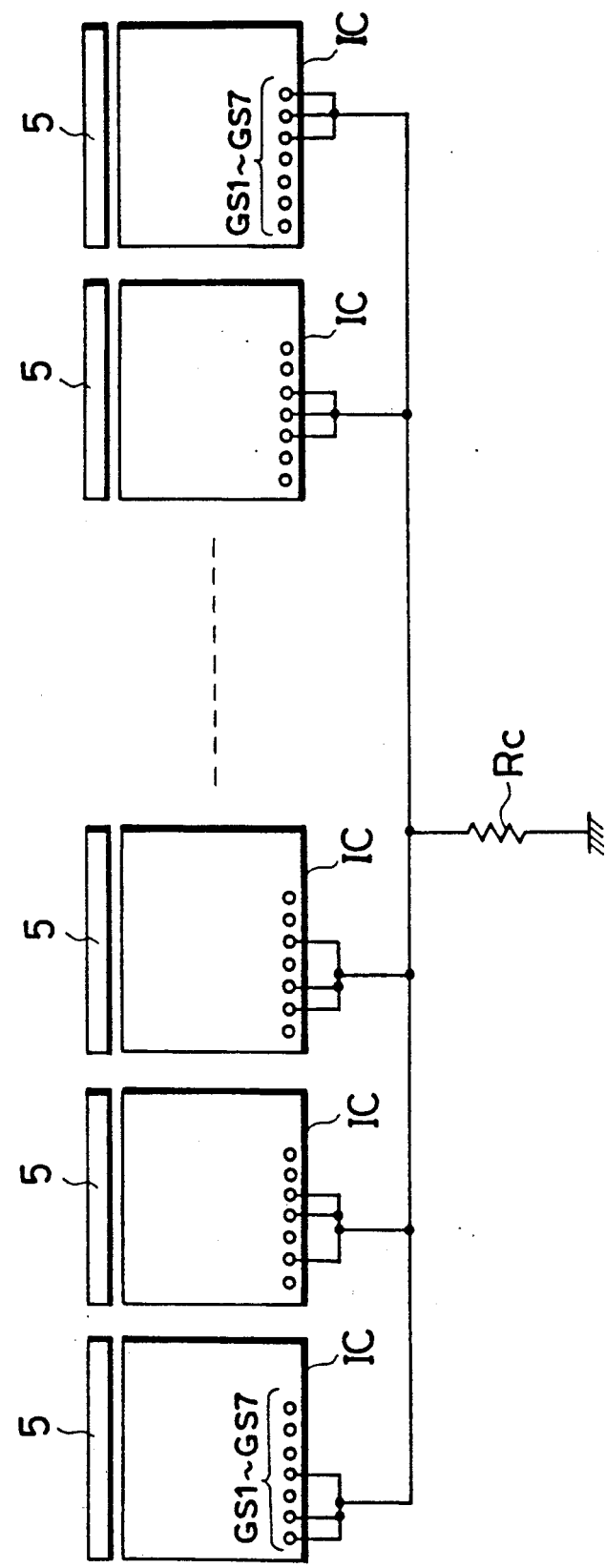
FIG. 18 is a schematic diagram showing how the gate voltage setting circuit of FIG. 17 is used.

FIG. 18 shows an example wherein differently selected three of the grounding terminals GS1-GS7 of the respective control circuits IC are connected to the common grounding resistor Rc. In this way, the associated LED array chips 5 are controlled so that the average brightness of each array chip is maintained within a limited range.

Figure 19:
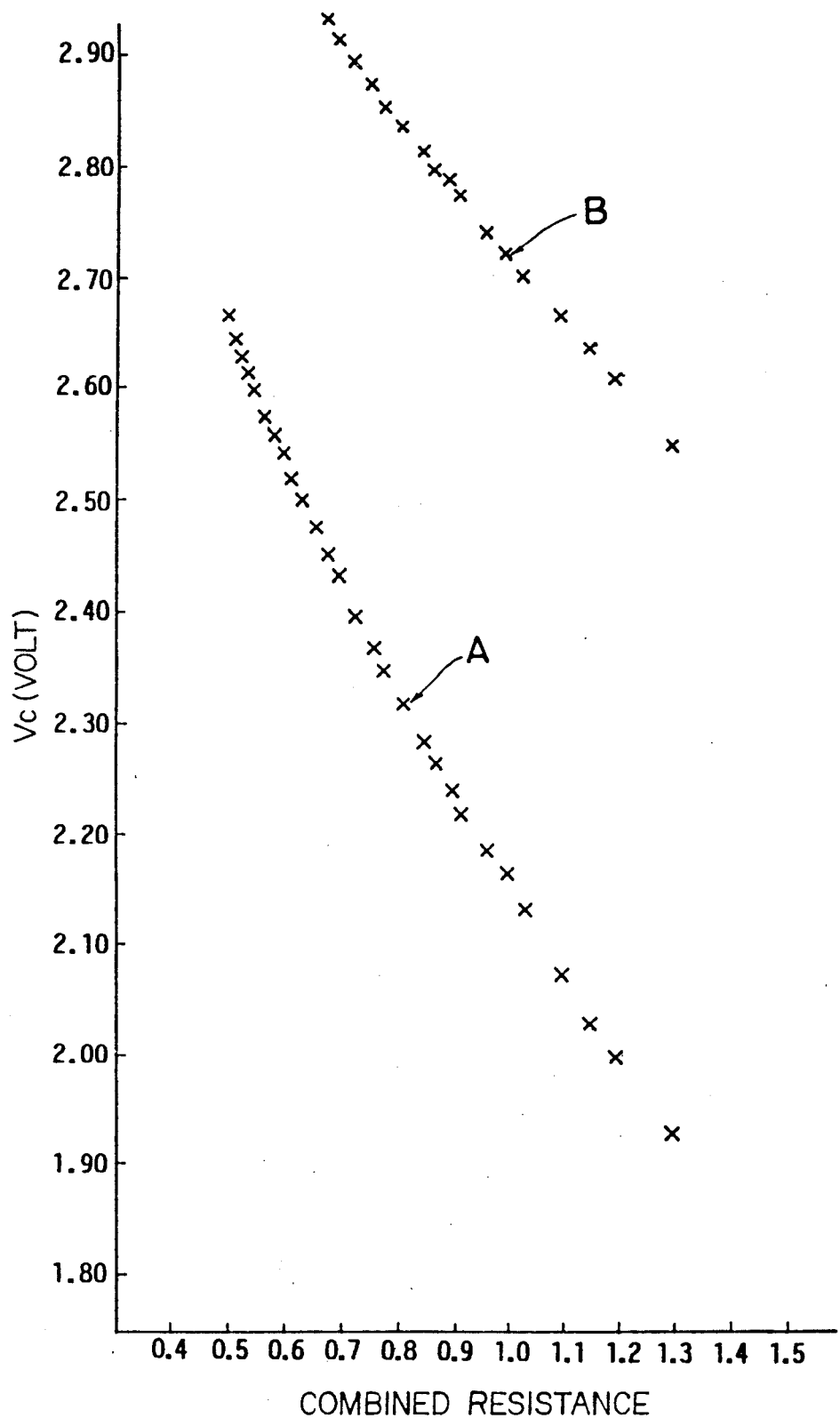
FIG. 19 is a graph showing the characteristic achieved by the gate voltage setting circuit of FIG. 17.

FIG. 19 shows a diagram which represents the achievable range of the gate voltage VG by various combinations of three grounding terminals when the voltage across the common grounding resistor Rc (FIG. 17) is set at 0.5 V. In FIG. 19, the curve A indicates various gate voltages available when only the resistor Ra of the first group is made effective, that is, when the terminal GS0 is shorted to the gate voltage terminal VG. On the other hand, the curve B indicates various gate voltages obtainable when the two resistors Ra, Rb of the first group are made effective. It is understood from FIG. 19 that the gate voltage VG may be varied or adjusted minutely within a wide range of 1.90–2.90 V.

Obviously, the second resistor group of the gate voltage setting circuit 27 may include more or less than seven parallel resistors. Further, any number of the second group resistors R1–R7 may be selected to increase the range of gate voltage adjustment.

Referring again to FIG. 17, each logic gate LG1–LG64 is shown to include a pair of MOS field effect transistors Ta, Tb which are opposite in polarity. One transistor Ta is activated to supply the source voltage VDD to the corresponding MOSFET TR1–TR64 of the drive transistor circuit when the signal from the corresponding AND gate GA1–GA64 is high. The other transistor Tb is activated to supply the gate voltage VG when the signal from the AND gate is low.

Figure 20:
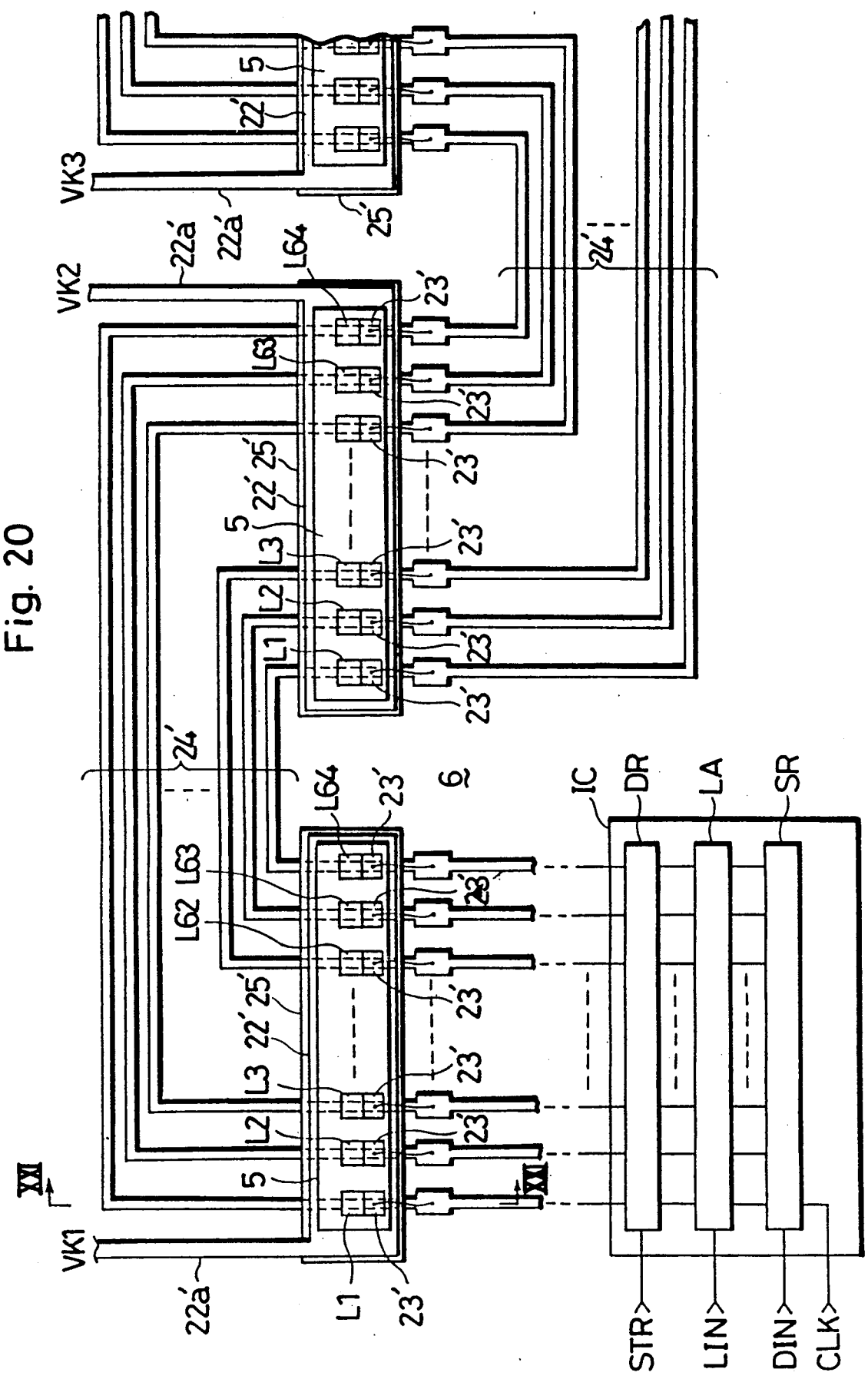
FIG. 20 is a plan view showing a modified conductor pattern suitable for matrix control of the optical printer shown in FIGS. 1 or 10.

FIG. 20 shows a modified arrangement wherein all of the LED array chips 5 are driven in succession by a single control circuit IC on the basis of time division. This manner of drive control is called "matrix control", and often used for LED print heads which are incorporated in cheaper printers not requiring a high printing speed.

As shown in FIG. 20, the substrate 6 is formed with separate cathode strips 22' on each of which is mounted a corresponding LED array chip 5 incorporating an array of light emitting diodes L1–L64. Each cathode strip 22' has a terminal lead 22a for grounding. The cathode of each diode is held in conduction with the cathode strip, whereas the anode of the diode is held in conduction with an associated anode pad 23.

A pattern of parallel anode leads 24' connected to the single control circuit IC extends under and across the respective cathode strips 22' in a manner such that the anode leads do not intersect with each other, as shown in FIG. 20. For this purpose, each anode lead is made to bridge between two reversely corresponding diodes of each two adjacent chips 5. For example, the anode lead extending immediately under the first diode L1 of one chip is made to extend immediately under the last diode L64 of the next chip.

The anode leads 24' are connected to the anode pads 23' by wires 26'. An insulating layer 25' is interposed between the pattern of anode leads and each cathode strip 22', as better shown in FIG. 21.

Figure 21:
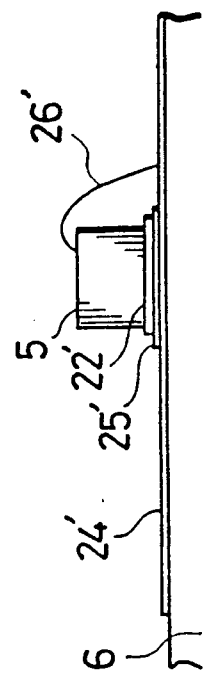
FIG. 21 is a sectional view taken on lines XXI—XXI in FIG. 20.

In the arrangement of FIGS. 20 and 21, the terminal leads 22a' of the respective cathode strip 22' can be taken out without intersecting with the pattern of anode leads 24' by utilizing chip spacings at an interval of every two chips, as shown in FIG. 20. Further, the sufficient spacing between each two adjacent chips 5 makes it easier t keep the cathode strips electrically independent from each other, thereby enabling the matrix control of the respective chips.

The single control circuit IC comprises a shift register SR, a latch circuit LA, and a drive circuit DR. Contrary to the example of FIG. 15, the shift register SR for the matrix control may be oriented to store each series of data in the order as received for an external data feeding circuit.

Figure 22A:
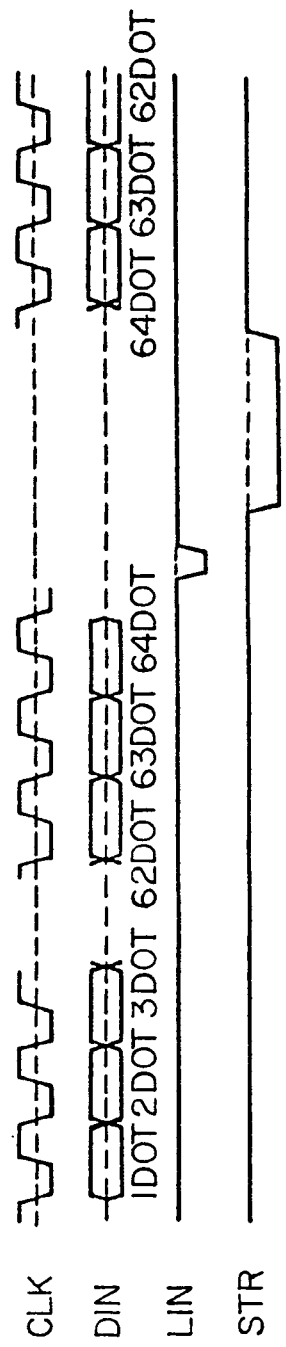

In operation according to the matrix control, each series of data is fed in the shift register SR in synchronism with a corresponding series of clock signals, as shown in FIGS. 22a and 22b. The thus registered series of data is latched by the latch circuit LA upon feeding of a latch signal. Upon feeding of a strobe signal, the latched series of data is supplied for driving the LEDs L1–L64 of a particular array chip 5 which is made active by feeding of a block signal VK.

According to the matrix control, all of the LED array chips 5 may be driven by successively activating them in timed relation with feeding of successive series of data. However, due to the image inversion provided by the convex lens system 4 (FIG. 1) as well as due to the specific anode lead connections (causing data inversion at every two chips 5), the successive series of data must be supplied to the shift register SR alternately in normal and reverse orders to ensure correct printing. According to the arrangement shown in FIG. 20, specifically, those series of data for the odd-numbered chips 5 are supplied to the shift register SR in reverse order, whereas those data for the even-numbered chips are supplied in normal order.

The supplying of alternately inverted series of data can be carried out by an external data feeding circuit. Alternatively, the control circuit IC itself may be modified to register, alternately in normal and reverse orders, successive series of data which are always supplied in normal order.

The present invention being thus described, it is obvious that the same may be modified in many other ways. Such variations are not to be regarded as a departure from the spirit and scope of the invention, and all such modifications as would be obvious to those skilled in art are intended to be included within the scope of the followings claims.

We claim:

1. An apparatus for optically writing information comprising:
   at least one row of LED array chips arranged as spaced from each other along said at least one row, each array chip including a plurality of light emitting diodes constantly spaced along said row to provide luminescent dots;
   a photosensitive surface arranged in facing relation to said at least one row of LED array chips in parallel thereto; and
   a lens system disposed between said photosensitive surface and said at least one row of LED array chips, said lens system including a row of convex lens elements arranged in corresponding relation to said at least one row of LED array chips, the distance between said row of convex lens elements and said at least one row of LED array chips being larger than the focal length (f) of each lens element but less than double the focal length so that magnified images of the luminescent dots of each LED array chip are formed on said photosensitive surface in an inverted arrangement, the magnification of the respective convex lens elements being such that all of the dot images on said photosensitive surface are constantly spaced without image overlapping.

2. The apparatus as defined in claim 1, wherein said lens system is held by an elongate lens holder which has a light shielding partition wall extending toward the spacing between each two adjacent LED array chips.

3. The apparatus as defined in claim 2, wherein the respective convex lens elements are separate from each other and individually retained in place by a corresponding number of lens holding bores of said lens holder.

4. The apparatus as defined in claim 2, wherein said lens system comprises at least one lens array plate which has a plurality of integral convex lens portions serving as said convex lens elements.

5. The apparatus as defined in claim 4, wherein said lens array plate has a pair of longitudinal margins, and said lens holder has a longitudinal opening which is formed with a pair of longitudinal grooves for receiving said pair of longitudinal margins of said lens array plate.

6. The apparatus as defined in claim 4, wherein said lens holder is provided with a transparent guard plate covering said lens array plate.

7. The apparatus as defined in claim 1, wherein said row of LED array chips is mounted on a common cathode strip which is formed at each end with a terminal lead for grounding, said cathode strip being further formed with an auxiliary cathode lead extending from at least one of the spacings between said LED array chips.

8. The apparatus as defined in claim 1, wherein said row of LED array chips is mounted on a common cathode strip which is formed at each end with a terminal lead for grounding, said cathode strip being further formed with an auxiliary cathode lead extending from each of the spacings between said LED array chips.

9. The apparatus as defined in claim 1, wherein the respective LED array chips are driven by separate control circuits respectively incorporating shift registers to which corresponding series of data are feed in succession, the respective shift registers being oriented so that the data shifting direction within each shift register is opposite to the data transmitting direction between the shift registers.

10. The apparatus as defined in claim 1, wherein the respective LED array chips are driven by separate control circuits each incorporating a plurality of drive transistors for driving the respective light emitting diodes of a corresponding LED array chip, each control circuit further incorporating a gate voltage setting circuit which applies an adjustable gate voltage to the respective drive transistors, said gate voltage setting circuit providing gate voltage adjustment simply by selecting combination among a plurality of voltage dividing resistors which are incorporated in advance into said gate voltage setting circuit.

11. The apparatus as defined in claim 10, wherein said gate voltage setting circuit comprises a first resistor portion connected between a source voltage supplying terminal and a gate voltage supplying terminal, and a second resistor portion which includes a plurality of selectable resistors having different resistivities, respective one ends of said selectable resistors being connected commonly to said gate voltage supplying terminal, the respective other ends of said selectable resistors being connected to separate outlet terminals.

12. The apparatus as defined in claim 1, wherein the respective LED array chips are mounted individually on separate cathode strips spaced from each other along said row of LED array chips, all of the LED array chips being controlled by a single control circuit on the basis of time division.

13. The apparatus as defined in claim 12, wherein a single pattern of parallel anode leads extends under and across the respective cathode strips, each cathode strip being formed at one end thereof with a cathode lead extending without intersecting with said pattern of anode leads.

14. The apparatus for optically detecting information comprising:
at least one row of sensor array chips arranged as spaced from each other along said at least one row, each array chip including a plurality of light emitting diodes constantly spaced along said at least one row;
an image surface arranged in facing relation to said at least one row of sensor array chips in parallel thereto, said image surface providing an overall effective width divided into unit array width portions which correspond in number to said sensor array chips and are constantly spaced from each other, each unit width portion containing picture element width portions which are arranged at a constant pitch and correspond in number to the light receiving elements of the corresponding sensor array chip, said pitch being equal to the spacing between said unit width portions; and
a lens system disposed between said image surface and said at least one row of sensor array chips, said lens system including a row of convex lens elements arranged in corresponding relation to said at least one row of sensor array chips, the distance between said row of convex lens elements and said at least one row of sensor array chips being larger than the focal length (f) of each lens element but less than double the focal length, each lens element functioning to provide image reduction and inversion so that the distance between the farthest picture element width portions within the corresponding unit array width portion exactly corresponds to the distance between the farthest light receiving elements within the corresponding sensor array chip.

* * * * *